US010235926B2

(12) United States Patent
In et al.

(10) Patent No.: US 10,235,926 B2
(45) Date of Patent: Mar. 19, 2019

(54) SCANLINE DRIVER AND DISPLAY DEVICE INCLUDING THE SAME

(71) Applicant: Samsung Display Co., Ltd., Yongin-si, Gyeonggi-do (KR)

(72) Inventors: Hai-Jung In, Seoul (KR); Bo-Yong Chung, Suwon-si (KR)

(73) Assignee: SAMSUNG DISPLAY CO., LTD., Yongin-si, Gyeonggi-Do (KR)

(*) Notice: Subject to any disclaimer, the term of this patent is extended or adjusted under 35 U.S.C. 154(b) by 166 days.

(21) Appl. No.: 15/354,835

(22) Filed: Nov. 17, 2016

(65) Prior Publication Data
US 2017/0140697 A1 May 18, 2017

(30) Foreign Application Priority Data
Nov. 18, 2015 (KR) .................... 10-2015-0161861

(51) Int. Cl.
*G09G 3/20* (2006.01)
*G09G 3/36* (2006.01)
(Continued)

(52) U.S. Cl.
CPC ......... *G09G 3/2092* (2013.01); *G09G 3/3266* (2013.01); *G09G 3/36* (2013.01);
(Continued)

(58) Field of Classification Search
CPC ... G09G 2300/0809; G09G 2310/0267; G09G 2310/0291; G09G 2320/045;
(Continued)

(56) References Cited

U.S. PATENT DOCUMENTS

2005/0008114 A1* 1/2005 Moon .................. G09G 3/3677 377/64
2010/0134399 A1* 6/2010 Ki ........................ G09G 3/3677 345/94
(Continued)

FOREIGN PATENT DOCUMENTS

EP         2 009 618 A2    12/2008
KR    10-2004-0061210 A     7/2004
KR    10-2004-0092775 A    11/2004

OTHER PUBLICATIONS

Extended European Search Report dated Mar. 7, 2017 for European Patent Application No. EP 16 199 683.0, which corresponds to subject U.S. Appl. No. 15/354,835.

*Primary Examiner* — Dmitriy Bolotin
(74) *Attorney, Agent, or Firm* — F. Chau & Associates, LLC

(57) ABSTRACT

A scanline driver and a display device including the same are disclosed. In one aspect, the scanline driver includes a driving circuit configured to provide a first driving signal to a first driving node and a second driving signal to a second driving node based on a scan input signal and a plurality of clock signals. The driving circuit includes a plurality of driving transistors and a plurality of reset transistors. The scanline driver also includes a buffer circuit configured to generate a scan output signal based on the first and second driving signals. The buffer circuit includes a plurality of buffer transistors. Each of the driving transistors and the buffer transistors includes a floating gate transistor which includes a floating gate configured to transfer a voltage corresponding to a second logic low level lower than a first logic low level.

25 Claims, 11 Drawing Sheets

(51) Int. Cl.
  *H01L 27/12* (2006.01)
  *G09G 3/3266* (2016.01)
(52) U.S. Cl.
  CPC ......... *G09G 3/3674* (2013.01); *H01L 27/124* (2013.01); *H01L 27/1255* (2013.01); *G09G 2300/0809* (2013.01); *G09G 2310/0267* (2013.01); *G09G 2310/0291* (2013.01); *G09G 2320/045* (2013.01)
(58) Field of Classification Search
  CPC .. G09G 3/2092; G09G 3/3266; G09G 3/3674; G09G 3/36; H01L 27/124; H01L 27/1255
  See application file for complete search history.

(56) References Cited

U.S. PATENT DOCUMENTS

| | | | | |
|---|---|---|---|---|
| 2010/0156474 | A1* | 6/2010 | Park | G09G 3/3677 327/108 |
| 2010/0260312 | A1* | 10/2010 | Tsai | G09G 3/3677 377/79 |
| 2012/0206432 | A1* | 8/2012 | Kang | G09G 3/3266 345/212 |
| 2014/0118236 | A1 | 5/2014 | Jin et al. | |
| 2014/0204009 | A1* | 7/2014 | Kim | G09G 3/3677 345/92 |
| 2016/0035262 | A1* | 2/2016 | Lee | G11C 19/28 345/690 |

* cited by examiner

SCANLINE DRIVER AND DISPLAY DEVICE INCLUDING THE SAME

CROSS-REFERENCE TO RELATED APPLICATION(S)

This application claims priority under 35 USC § 119 to Korean Patent Application No. 10-2015-0161861, filed on Nov. 18, 2015 in the Korean Intellectual Property Office (KIPO), the contents of which are incorporated herein in its entirety by reference.

BACKGROUND

Field

The described technology generally relates to a scanline driver and a display device including the same.

Description of the Related Technology

Research and development activities are conducted on high performance display devices and included circuitry. For example, a scan driver (or scanline driver) is a circuit that is used to activate the pixels in a row at a time such that a frame period will cause emission over the entire matrix of pixels in the display.

SUMMARY OF CERTAIN INVENTIVE ASPECTS

One inventive aspect relates to a high performance scanline driver including a driving transistor and a buffer transistor that include a floating gate transferred a voltage corresponding to a second logic low level lower than a first logic low level.

Another aspect is a display device including the above scanline driver.

Another aspect is a scanline driver that includes a driving circuit to provide a first driving signal to a first driving node and to provide a second driving signal to a second driving node based on a scan input signal and clock signals, the driving circuit including driving transistors and reset transistors; and a buffer circuit to generate a scan output signal based on the first driving signal and the second driving signal, the buffer circuit including buffer transistors, wherein each of the driving transistors and the buffer transistors is implemented as a floating gate transistor which includes a floating gate transferred a voltage corresponding to a second logic low level lower than a first logic low level.

In example embodiments, the floating gate transistor includes a gate capacitor, and the gate capacitor electrically connects a gate of the floating gate transistor with the floating gate.

In example embodiments, the floating gate is electrically connected to a first terminal of a transferring transistor, and a voltage corresponding to the second logic low level is provided to a second terminal of the transferring transistor.

In example embodiments, the transferring transistor is turned on based on a set signal.

In example embodiments, the transferring transistor is turned on when the set signal is logic high level, and a voltage corresponding to the second logic low level is provided to the floating gate.

In example embodiments, the transferring transistor is turned off when: a voltage at the floating gate is a voltage corresponding to the second logic low level, and a voltage at the gate of the floating gate transistor is a voltage corresponding to the first logic low level.

In example embodiments, the transferring transistor is turned off when the set signal is a third logic low level, where the third logic low level is different from the first logic low level and the second logic low level.

In example embodiments, the third logic low level is lower than the second logic low level.

In example embodiments, a first terminal of a first reset transistor among the reset transistors is electrically connected to the first driving node, and a voltage corresponding to the first logic low level is provided to a second terminal of the first reset transistor.

In example embodiments, the first reset transistor is turned on based on a set signal.

In example embodiments, the first reset transistor is turned on when the set signal is a logic high level, and a voltage corresponding to the first logic low level is provided to the first driving node.

In example embodiments, a first terminal of a second reset transistor among the reset transistors is electrically connected to the second driving node, and a voltage corresponding to the first logic low level is provided to a second terminal of the second reset transistor.

In example embodiments, the second reset transistor is turned on based on a set signal.

In example embodiments, the second reset transistor is turned on when the set signal is a logic high level, and a voltage corresponding to the first logic low level is provided to the second driving node.

In example embodiments, a set signal has a logic high level during a set period among operation periods of the scanline driver, and each of the clock signals is the first logic low level during the set period among operation periods of the scanline driver.

In example embodiments, the set signal has a third logic low level lower than the second logic low level during a reset period among the operation periods of the scanline driver, and each of the clock signals is the logic high level during the reset period among the operation periods of the scanline driver.

In example embodiments, each of a second clock signal and a third clock signal among the clock signals have the first logic low level when a first clock signal among the clock signal is the logic high level during a sequential driving period among the operation periods of the scanline driver.

Another aspect is a display device that includes scanline drivers to provide a scan output signal to a scanline based on clock signals and a scan input signal; and a pixel array to be driven based on the scan output signal, wherein each of the scanline drivers includes a driving circuit to provide a first driving signal to a first driving node and to provide a second driving signal to a second driving node based on the scan input signal and the clock signals, the driving circuit including driving transistors and reset transistors; and a buffer circuit to generate a scan output signal based on the first driving signal and the second driving signal, the buffer circuit including buffer transistors, and wherein each of the driving transistors and the buffer transistors is implemented as a floating gate transistor which includes a floating gate transferred a voltage corresponding to a second logic low level lower than a first logic low level.

In example embodiments, the floating gate is electrically connected to a first terminal of a transferring transistor, a voltage corresponding to the second logic low level is provided to a second terminal of the transferring transistor, and the transferring transistor is turned on based on a set signal.

Another aspect is a display device that includes a clock signal provider to generate clock signals; scanline drivers to provide a scan output signal to a scanline based on the clock signals and a scan input signal; and a pixel array to be driven based on the scan output signal, wherein each of the scanline drivers includes a driving circuit configured to provide a first driving signal to a first driving node and to provide a second driving signal to a second driving node based on the scan input signal and the clock signals, the driving circuit including driving transistors and reset transistors; and a buffer circuit configured to generate a scan output signal based on the first driving signal and the second driving signal, the buffer circuit including buffer transistors, and wherein each of the driving transistors and the buffer transistors is implemented as a floating gate transistor which includes a floating gate transferred a voltage corresponding to a second logic low level lower than a first logic low level.

Another aspect is a scanline driver that includes a driving circuit to provide a first driving signal to a first driving node and to provide a second driving signal to a second driving node based on a scan input signal and clock signals, the driving circuit including driving transistors and reset transistors; and a buffer circuit to generate a scan output signal based on the first driving signal and the second driving signal, the buffer circuit including buffer transistors, wherein each of the driving transistors and the buffer transistors is implemented as a floating body transistor which includes a floating body transferred a voltage corresponding to a second logic low level lower than a first logic low level.

In example embodiments, the floating body transistor includes a gate capacitor, and the gate capacitor electrically connects a gate of the floating body transistor with the floating body.

In example embodiments, the floating body is electrically connected to a first terminal of a transferring transistor, and a voltage corresponding to the second logic low level is provided to a second terminal of the transferring transistor.

In example embodiments, the transferring transistor is turned on based on a set signal, and a voltage corresponding to the second logic low level is provided to the floating body.

In example embodiments, the transferring transistor is turned off when a voltage at the floating body is a voltage corresponding to the second logic low level, and a voltage at the gate of the floating body transistor is a voltage corresponding to the first logic low level.

Another aspect is a scanline driver comprising: a driving circuit configured to provide a first driving signal to a first driving node and a second driving signal to a second driving node based on a scan input signal and a plurality of clock signals, wherein the driving circuit includes a plurality of driving transistors and a plurality of reset transistors; and a buffer circuit configured to generate a scan output signal based on the first and second driving signals, wherein the buffer circuit includes a plurality of buffer transistors, wherein each of the driving transistors and the buffer transistors includes a floating gate transistor which includes a floating gate configured to transfer a voltage corresponding to a second logic low level lower than a first logic low level.

In the above scanline driver, the floating gate transistor includes a gate capacitor configured to electrically connect a gate electrode of the floating gate transistor and the floating gate.

In the above scanline driver, the floating gate transistor includes a transferring transistor having a first terminal and a second terminal, wherein the floating gate is electrically connected to the first terminal, and wherein the second terminal is configured to receive a voltage corresponding to the second logic low level.

In the above scanline driver, the transferring transistor is configured to be turned on based on a set signal.

In the above scanline driver, the transferring transistor is configured to be turned on when the set signal has a logic high level, wherein the floating gate is configured to receive a voltage corresponding to the second logic low level.

In the above scanline driver, the transferring transistor is configured to be turned off when i) a voltage at the floating gate is a voltage corresponding to the second logic low level and ii) a voltage at the gate electrode of the floating gate transistor is a voltage corresponding to the first logic low level.

In the above scanline driver, the transferring transistor is configured to be turned off when the set signal has a third logic low level different from the first and second logic low levels.

In the above scanline driver, the third logic low level is lower than the second logic low level.

In the above scanline driver, the reset transistors include a first reset transistor having a first terminal electrically connected to the first driving node and a second terminal, wherein the second terminal of the first reset transistor is configured to receive a voltage corresponding to the first logic low level.

In the above scanline driver, the first reset transistor is configured to be turned on based on a set signal.

In the above scanline driver, the first reset transistor is configured to be turned on when the set signal has a logic high level greater than the first and second logic low levels, wherein the first driving node is configured to receive a voltage corresponding to the first logic low level.

In the above scanline driver, the reset transistors further include a second reset transistor having a first terminal electrically connected to the second driving node and a second terminal, wherein the second terminal of the second reset transistor is configured to receive a voltage corresponding to the first logic low level In the above scanline driver, the second reset transistor is configured to be turned on based on a set signal.

In the above scanline driver, the second reset transistor is configured to be turned on when the set signal has a logic high level, and wherein the second driving node is configured to receive a voltage corresponding to the first logic low level.

In the above scanline driver, the scanline driver has a plurality of operation periods including a set period, wherein a set signal has a logic high level during the set period, and wherein each of the clock signals has the first logic low level during the set period.

In the above scanline driver, the operation periods further include a reset period, wherein the set signal has a third logic low level lower than the second logic low level during the reset period, and wherein each of the clock signals has the logic high level during the reset period.

In the above scanline driver, the operation periods further include a sequential driving period, wherein the clock signals include first, second and third clock signals, and wherein each of the second and third clock signals has the first logic low level when the first clock signal has the logic high level during the sequential driving period.

Another aspect is a display device comprising: a plurality of scanline drivers each configured to provide a scan output signal to a scanline based on a plurality of clock signals and a scan input signal; and a pixel array configured to be driven based on the scan output signal. Each of the scanline drivers includes: a driving circuit configured to provide a first driving signal to a first driving node and a second driving signal to a second driving node based on the scan input signal and the clock signals, wherein the driving circuit includes a plurality of driving transistors and a plurality of reset transistors; and a buffer circuit configured to generate a scan output signal based on the first and second driving signals, wherein the buffer circuit includes a plurality of buffer transistors. Each of the driving transistors and the buffer transistors is includes a floating gate transistor which includes a floating gate configured to transfer a voltage corresponding to a second logic low level lower than a first logic low level.

In the above display device, the floating gate transistor includes a transferring transistor having a first terminal and a second terminal, wherein the floating gate is electrically connected to the first terminal, wherein the second terminal is configured to receive a voltage corresponding to the second logic low level, and wherein the transferring transistor is configured to be turned on based on a set signal.

Another aspect is a display device comprising: a clock signal provider configured to generate a plurality of clock signals; a plurality of scanline drivers each configured to provide a scan output signal to a scanline based on the clock signals and a scan input signal; and a pixel array configured to be driven based on the scan output signal. Each of the scanline drivers includes: a driving circuit configured to provide a first driving signal to a first driving node and a second driving signal to a second driving node based on the scan input signal and the clock signals, wherein the driving circuit includes a plurality of driving transistors and a plurality of reset transistors; and a buffer circuit configured to generate a scan output signal based on the first and second driving signals, wherein the buffer circuit includes a plurality of buffer transistors. Each of the driving transistors and the buffer transistors includes a floating gate transistor which includes a floating gate transferred a voltage corresponding to a second logic low level lower than a first logic low level.

Another aspect is a scanline driver comprising: a driving circuit configured to provide a first driving signal to a first driving node and a second driving signal to a second driving node based on a scan input signal and a plurality of clock signals, wherein the driving circuit includes a plurality of driving transistors and a plurality of reset transistors; and a buffer circuit configured to generate a scan output signal based on the first and second driving signals, wherein the buffer circuit includes a plurality of buffer transistors, wherein each of the driving transistors and the buffer transistors is includes a floating body transistor which includes a floating body configured to transfer a voltage corresponding to a second logic low level lower than a first logic low level.

In the above scanline driver, the floating body transistor includes a gate electrode and a gate capacitor configured to electrically connect the gate electrode and the floating body.

In the above scanline driver, the floating body transistor includes a transferring transistor having a first terminal and a second terminal, wherein the floating body is electrically connected to the first terminal, and wherein the second terminal of the transferring transistor is configured to receive a voltage corresponding to the second logic low level.

In the above scanline driver, the transferring transistor is configured to be turned on based on a set signal, wherein the floating body is configured to receive a voltage corresponding to the second logic low level.

In the above scanline driver, the transferring transistor is configured to be turned off when i) a voltage at the floating body is a voltage corresponding to the second logic low level, and ii) a voltage at the gate electrode of the floating body transistor is a voltage corresponding to the first logic low level.

According to at least one of the disclosed embodiments, the performance of a scanline driver can improve by providing (or, including) driving transistors and buffer transistors that include a floating gate transferred a voltage corresponding to a second logic low level lower than a first logic low level.

In addition, the performance of a scanline driver can improve by providing (or, including) driving transistors and buffer transistors that include a floating body transferred a voltage corresponding to a second logic low level lower than a first logic low level.

DETAILED DESCRIPTION OF CERTAIN INVENTIVE EMBODIMENTS

Hereinafter, the described technology will be explained in detail with reference to the accompanying drawings. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Figure 1:
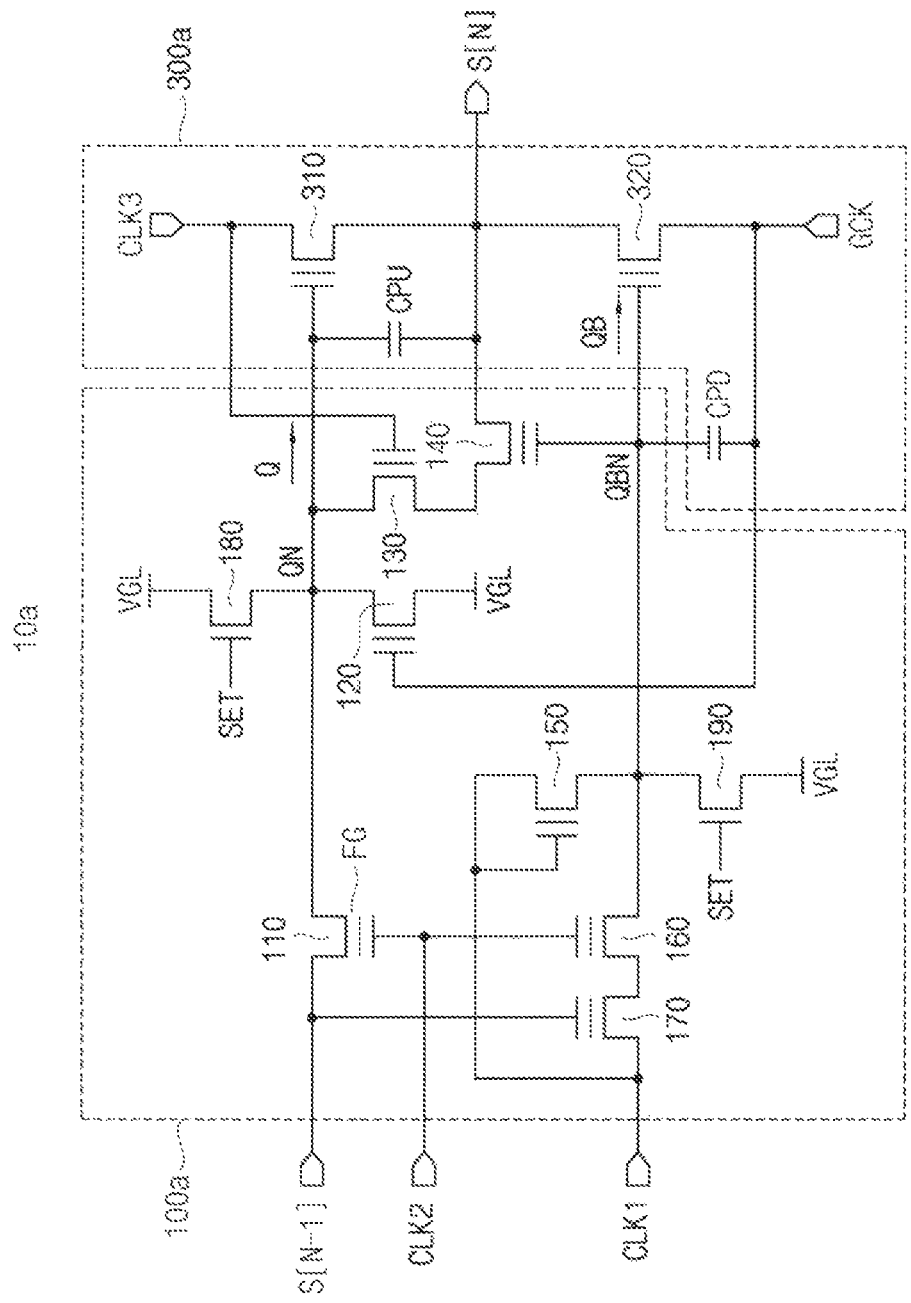
FIG. 1 is a circuit diagram illustrating a scanline driver according to example embodiments.

FIG. 1 is a circuit diagram illustrating a scanline driver 10a according to example embodiments.

Referring to FIG. 1, the scanline driver 10a (or, a scan line driver, a scan driver) includes a driving circuit 100a and a buffer circuit 300a. The driving circuit 100a can include driving transistors 100 through 170 and reset transistors 180 and 190 (or, reset-transistors). For example the driving transistors include first through seventh driving transistors 110 through 170, and the reset transistors can include a first reset transistor 180 and the second reset transistor 190.

The driving circuit 100a can provide a first driving signal Q to a first driving node QN and can provide a second driving signal QB to a second driving node QBN based on a scan input signal S[N−1] and clock signals CLK1, CLK2, and CLK3.

A first terminal of the first reset transistor 180 among the reset transistors 180 and 190 can be electrically connected to the first driving node QN, and a voltage corresponding to a first logic low level VGL can be provided to a second terminal of the first reset transistor 180. For example, the first reset transistor 180 is turned on based on a set signal SET. When the set signal SET is (or, has) a logic high level H, the first reset transistor 180 can be turned on, and a voltage corresponding to the first logic low level VGL can be provided to the first driving node QN.

A first terminal of the second reset transistor 190 among the reset transistors 180 and 190 can be electrically connected to the second driving node QBN, and a voltage corresponding to the logic low level VGL can be provided to a second terminal of the second reset transistor 190. For example, the second reset transistor 190 is turned on based on a set signal SET. When the set signal SET is (or, has) the logic high level H, the second reset transistor 190 can be turned on, and a voltage corresponding to the first logic low level VGL can be provided to the second driving node QBN.

The buffer circuit 300a can include buffer transistors 310 and 320. The buffer circuit 300a can provide (or, transfer) a scan output signal S[N] based on the first driving signal Q and the second driving signal QB. For example, the buffer transistors include a first buffer transistor 310 and a second buffer transistor 320.

When the first driving signal Q provided to the first driving node QN is the logic high level H and the second driving signal QB is provided to the second driving node QBN is the first logic low level VGL, the first buffer transistor 310 can be turned on, and the second buffer transistor 320 can be tuned off. When the first buffer transistor 310 is turned on and the second buffer transistor 320 is turned off, a third clock signal CLK3 among the clock signals can be provided as the scan output signal S[N]. For example, the second logic low level VGL' is lower than (or, smaller) than the first logic low level VGL, and a third logic low level VGL" can be lower than the second logic low level VGL'.

In addition, when the first driving signal Q provided to the first driving node QN is the first logic low level VGL and the second driving signal QB provided to the second driving node QBN is the logic high level H, the first buffer transistor 310 can be tuned on, and the second buffer transistor 320 can be turned on. When the first buffer transistor 310 is turned off and the second buffer transistor 320 is turned off, a global clock signal GCLK among the clock signals can be provided as the scan output signal S[N].

In some example embodiments, a floating gate transistor 110 includes a floating gate FG transferring (or, receiving) a voltage corresponding to the second logic low level VGL' which is smaller than the first logic low level VGL. Each of the driving transistors 110 through 170 and the buffer transistors 310 and 320 can be implemented with a floating gate transistor 110.

In some example embodiments, a floating body transistor 120 includes a floating body FB transferring (or, receiving) a voltage corresponding to the second logic low level VGL' which is smaller than the first logic low level VGL. Each of the driving transistors 110 through 170 and the buffer transistors 310 and 320 can be implemented with a floating body transistor 120.

As described later with reference to FIGS. 2 and 3, a threshold voltage of an N-MOS (i.e., an N-type metal oxide semiconductor) transistor included in the scanline driver 10a can be moved (or, be shifted) in a negative direction as an operation time of the scanline driver 10a increases. When the threshold voltage of the N-MOS transistor is moved in a negative direction, the N-MOS transistor 200 can be turned on even though a voltage corresponding to the first logic low level VGL to the N-MOS transistor 200. The floating gate transistor 110 (or, the floating body transistor 120) according to example embodiments can include the floating gate FG (or, the floating body FB) which can transfer a voltage corresponding to the second logic low level VGL' lower than the first logic lower level VGL to prevent the N-MOS transistor 200 turning on when a voltage corresponding to the first logic low level VGL is provided to a gate of the N-MOS transistor 200.

The scanline driver 10a according to example embodiments can improve a performance by providing (or, including) the driving transistors 110 through 170 and the buffer transistors 310 and 320 that include the floating gate FG (or, the floating body FB) which can transfer a voltage corresponding to the second logic low level VGL' lower than the first logic low level VGL.

Figure 2:
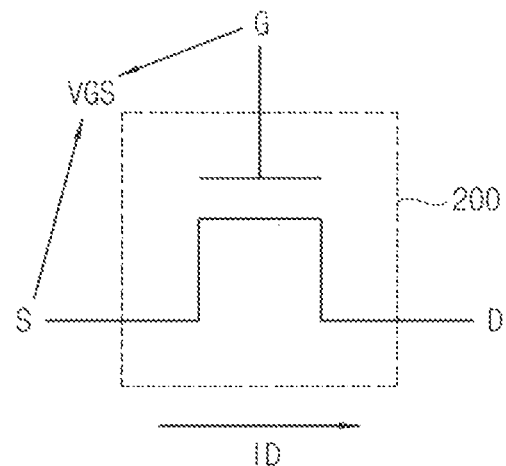
FIG. 2 is a diagram illustrating an example of a typical N-MOS transistor.

FIG. 2 is a diagram illustrating an example of a typical N-MOS transistor. FIG. 3 is a diagram for describing a change of a threshold voltage of the typical N-MOS transistor 200 of FIG. 2.

Figure 3:
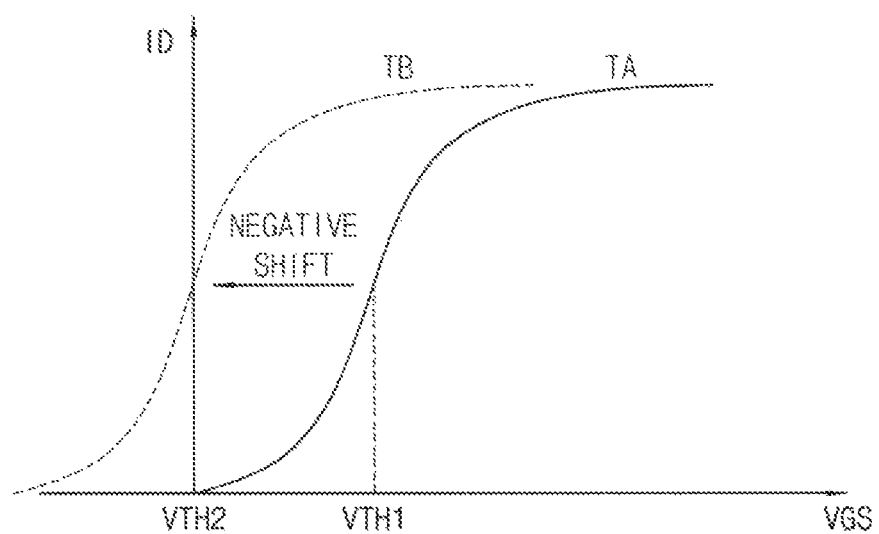
FIG. 3 is a diagram for describing a change of a threshold voltage of the typical N-MOS transistor of FIG. 2.

Referring to FIGS. 2 and 3, a current ID between a source S and a drain of the N-MOS transistor 200 increases as a voltage VGS between a gate G and the source S of the N-MOS transistor 200. At a first time TA, a threshold voltage of the N-MOS transistor can be a first threshold voltage VTH1. At a second time TB after the first time TA, the threshold voltage of the N-MOS transistor can be a second threshold voltage VTH2. The second threshold voltage VTH2 can be lower (or, smaller) than the first threshold voltage VTH1. The threshold voltage of the N-MOS transistor 200 can be shifted in a negative direction as an operation time of the scanline driver 100a increase.

For example, the first threshold voltage VTH1, which is the threshold voltage of the N-MOS transistor 200 at the first time TA, can be about 0.5 volt (V), and the second threshold voltage VTH2, which is the threshold voltage of the N-MOS transistor 200 at the second time TB, can be about 0 V. At the first time TA, 0 V, which is a voltage corresponding to the first logic low level VGL, can be provided to the gate of the N-MOS transistor 200 to turn off the N-MOS transistor 200. When about 0 V, which is a voltage corresponding to the first logic low level VGL, can be provided to the gate of the N-MOS transistor 200 at the first time TA, the N-MOS transistor can be turned off. Because about 0 V, which is a voltage corresponding to the first logic low level VGL, is lower than about 0.5V which is the threshold voltage of the N-MOS transistor 200 at the first time TA.

Alternatively, at the second time TB, about 0 V, which is a voltage corresponding to the first logic low level VGL, can be provided to the gate of the N-MOS transistor 200 to turn off the N-MOS transistor 200. When about 0 V, which is a voltage corresponding to the first logic low level VGL, can be provided to the gate of the N-MOS transistor 200 at the second time TB, the N-MOS transistor can be turned on. Because about 0 V, which is a voltage corresponding to the first logic low level VGL, is the same as about 0 V which is the threshold voltage of the N-MOS transistor 200 at the second time TB.

At the second time TB, the N-MOS transistor 200 can be turned on even though about 0 V corresponding to the first logic low level VGL is provided to the gate of the N-MOS transistor 200 to turn on the N-MOS transistor 200. In this case, the scanline driver 200a which includes the N-MOS transistor 200 can be malfunctioning. The floating gate transistor 110 (or, the floating body transistor 120) according to example embodiments can include the floating gate FG (or, the floating body FB), which can transfer a voltage corresponding to the second logic low level VGL' lower than the first logic low level VGL, to prevent the scanline driver 10a malfunctioning.

Figure 4:
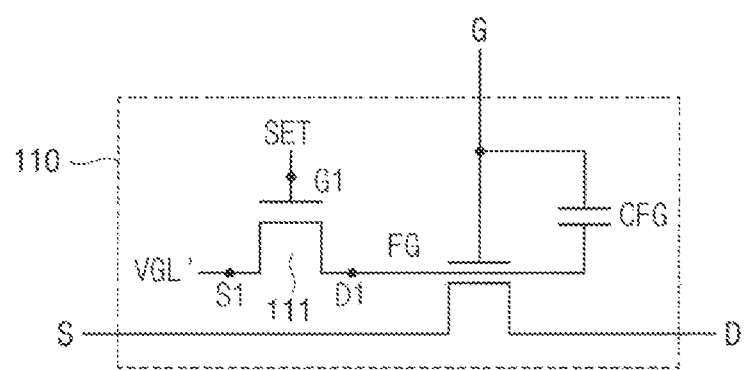
FIG. 4 is a circuit diagram illustrating an example of a floating gate transistor included in the scanline driver of FIG. 1.

FIG. 4 is a circuit diagram illustrating an example of the floating gate transistor 110 included in the scanline driver 10a of FIG. 1.

Referring to FIG. 4, the floating gate transistor 110 includes a gate capacitor CFG, a floating gate FG, and a transferring transistor 111 (or, a transmission transistor). The gate capacitor CFG included in the floating gate transistor 110 can electrically connect a gate G of the floating gate transistor 110 with the floating gate FG of the floating gate transistor 110. That is, the gate capacitor CFG can be disposed between the gate G of the floating gate transistor 110 and the floating gate FG of the floating gate transistor 110.

In some example embodiments, the floating gate FG is electrically connected to a first terminal of the transferring transistor 111, and a voltage corresponding to the second logic low level VGL' is provided to a second terminal of the transferring transistor 111. For example, the first terminal of the transferring transistor 111 is a drain D1 of the transferring transistor 111, and the second terminal of the transferring transistor 111 is a source S1 of the transferring transistor 111. The second logic low level VGL' can be lower than the first logic low level VGL. The floating gate FG can be electrically connected to the drain D1 of the transferring transistor 111, and a voltage corresponding to the second logic low level VGL' can be provided to the source S1 of the transferring transistor 111.

In some example embodiments, the transferring transistor 111 is turned on based on a set signal SET. When the set signal SET is logic high level H, the transferring transistor 111 can be turned on. When the transferring transistor 111 is turned on, a voltage corresponding to the second logic low level VGL' can be provided to the floating gate FG.

For example, at the first time TA, a threshold voltage of the floating gate transistor 110 is a first threshold voltage VTH1. At the second time TB after the first time TA, the threshold voltage of the floating gate transistor 110 can be a second threshold voltage VTH2. The first threshold voltage VTH1, which is the threshold voltage of the floating gate transistor 110 at the first time TA, can be about 0.5 volt (V), and the second threshold voltage VTH2, which is the threshold voltage of the floating gate transistor 110 at the second time TB, can be about 0 V. In addition, a voltage corresponding to the logic high level H can be about 1 V, a voltage corresponding to the first logic low level can be about 0 V, and a voltage corresponding to the second logic low level VGL' can be about −1 V.

At the first time TA, the transferring transistor 111 can be turned on when the set signal SET is (or, has) about 1 V. When the transferring transistor 111 is turned on, about −1 V, which is a voltage corresponding to the second logic low level, can be provided to the floating gate FG. When a voltage of the gate G of the floating gate transistor 110 (or, a voltage at the gate G of the floating gate transistor 110) is about 0 V, which is the first logic low level VGL, and a voltage of the floating gate FG (or, a voltage at the floating gate FG) is about −1 V, the floating gate transistor 110 can be tuned off. Because about −1 V, which is a voltage of the floating gate FG, is lower than about 0.5 V which is the first threshold voltage VTH1.

At the second time TB, the transferring transistor 111 can be turned on when the set signal SET is about 1 V. When the transferring transistor 111 is turned on, about −1 V, which is a voltage corresponding to the second logic low level, can be provided to the floating gate FG. When a voltage of the gate G of the floating gate transistor 110 is about 0 V, which is the first logic low level VGL, and a voltage of the floating gate FG is about −1 V, the floating gate transistor 110 can be tuned off. Because about −1 V, which is a voltage of the floating gate FG, is lower than about 0 V which is the second threshold voltage VTH2.

As described with reference to FIGS. 2 and 3, the N-MOS transistor 200 can be turned off because about 0 V corresponding to the first logic low level VGL, which is provided to the gate of the N-MOS transistor 200 at the first time TA, is lower than about 0.5 V corresponding to the threshold voltage of the N-MOS transistor 200 at the first time TA. However, the N-MOS transistor 200 can be turned on because about 0 V corresponding to the first logic low level VGL, which is provided to the gate of the N-MOS transistor 200 at the first time TA, is the same as about 0 V corresponding to the threshold voltage of the N-MOS transistor 200 at the second time TA. In this case, the scanline driver including the N-MOS transistor 200 can be malfunctioning. The floating gate transistor 110 according to example embodiments can include the floating gate FG, which can transfer a voltage corresponding to the second logic low level VGL' lower than the first logic low level VGL, to prevent the scanline driver 10a malfunctioning.

In some example embodiments, the floating gate transistor 110 is turned off when a voltage of the floating gate FG is a voltage corresponding to the second logic low level VGL' and a voltage of the gate G of the floating gate transistor 110 is a voltage corresponding to the first logic low level VGL.

In some example embodiments, the transferring transistor 111 can be turned off when the set signal SET is the third logic low level VGL" which is different from the first logic low level VGL and the second logic low level VGL'. Here, the third logic low level VGL" can be lower than the second logic low level VGL'.

For example, a voltage corresponding to the third logic low level VGL" can be about −2 V when a voltage corresponding to the first logic low level VGL is about 0 V and a voltage corresponding to the second logic lower level VGL' is about −1 V. A voltage of the set signal SET can be about −2 V, and a voltage of the source S1 of the transferring transistor 111 can be about −1 V. In this case, a voltage of the gate G1 of the transferring transistor 111 can be lower than a voltage of the source S1 of the transferring transistor 111. When the voltage of the gate G1 of the transferring transistor 111 is lower than the voltage of the source S1 of the transferring transistor 111, the transferring transistor 111 can be turned off. The voltage of the set signal SET can be lower than about −1 V, which is the voltage of the source S1 of the transferring transistor 111, to turn off the transferring transistor 111.

Figure 5:
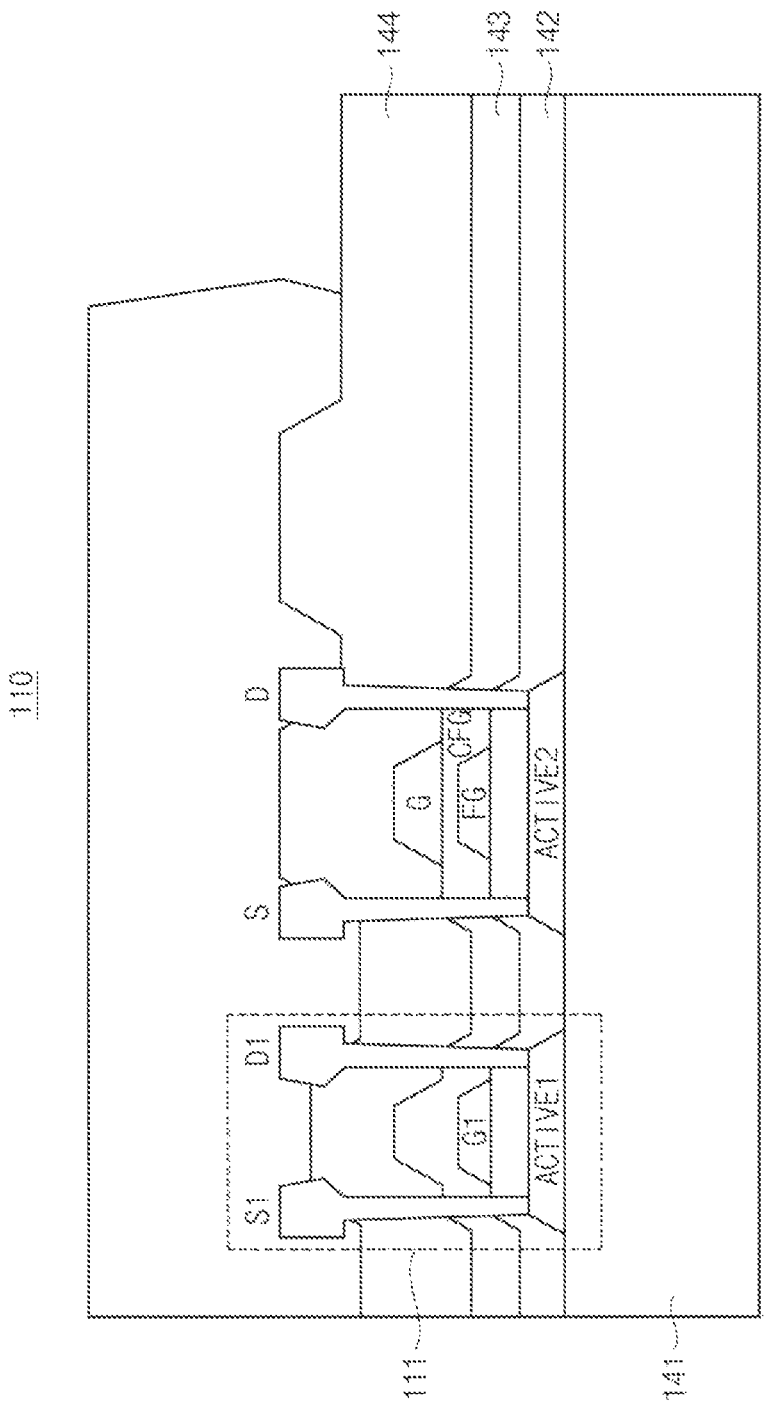
FIG. 5 is a cross-sectional view illustrating an example of the floating gate transistor of FIG. 4.

FIG. 5 is a cross-sectional view illustrating an example of the floating gate transistor 110 of FIG. 4.

Referring to FIGS. 4 and 5, the floating gate transistor 110 can include a gate capacitor CFG, a floating gate FG, and a transferring transistor 111. An active region (or, an active pattern) can be disposed on a substrate 141. The active region can include a first active region ACTIVE1 and a second active region ACTIVE2. A first insulating layer 142 can be disposed on the first active region ACTIVE1 and the second active region ACTIVE2. The gate G1 and the floating gate FG of the transferring transistor 111 can be disposed on the first insulating layer 142. A second insulating layer 143 can be disposed on the floating gate FG, and the gate G of the floating gate transistor 110 can be disposed on the second insulating layer 143.

When a voltage corresponding to the logic high level H is provided to the gate G1 of the transferring transistor 111, a voltage corresponding to the second logic low level VGL' can be transferred from the source S1 of the transferring transistor 111 through the first active region ACTIVE1 to the drain D1 of the transferring transistor 111. The drain D1 of the transferring transistor 111 can be electrically connected to the floating gate FG. When the voltage corresponding to the second logic low level VGL' is transferred from the source S1 of the transferring transistor 111 through the first active region ACTIVE1 to the drain D1 of the transferring transistor 111, a voltage of the floating gate FG can be a voltage corresponding to the second logic low level VGL'. When the voltage of the floating gate FG is the voltage corresponding to the second logic low level VGL' and the voltage of the gate G of the floating gate transistor 110 is the voltage corresponding to the first logic low level VGL, the floating gate transistor 110 can be turned off.

The scanline driver 10a according to example embodiments can improve a performance by providing (or, including) driving transistors 110 through 170 and buffer transistors 310 and 320 that include the floating gate FG transferring a voltage corresponding to the second logic low level VGL' lower than the first logic low level VGL.

Figure 6:
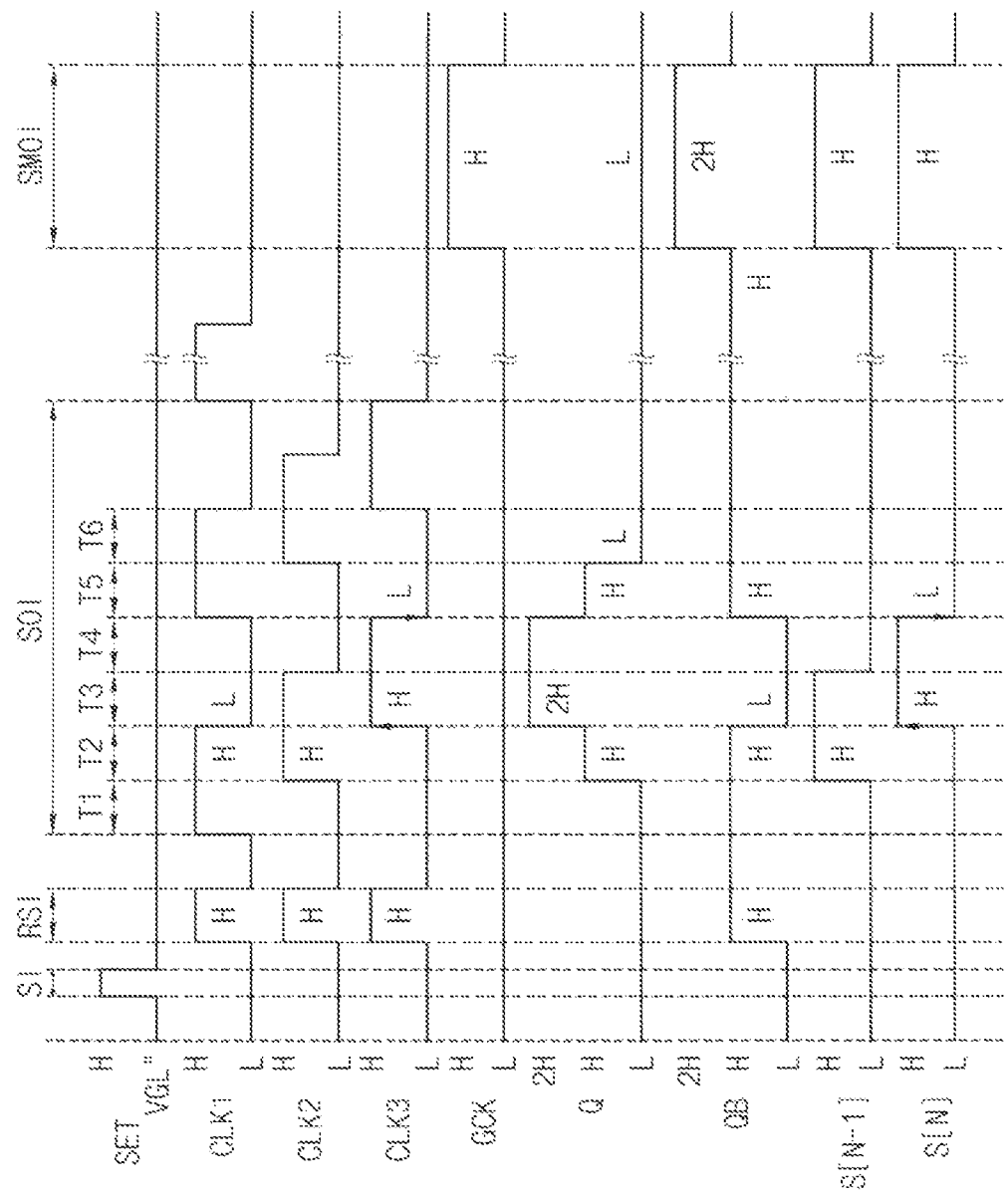
FIG. 6 is a timing diagram illustrating examples of operation periods of the scanline driver of FIG. 1.

FIG. 6 is a timing diagram illustrating examples of operation periods of the scanline driver 10a of FIG. 1.

Referring to FIGS. 1, 4, and 6, the operation periods of the scanline driver 10a can include a set period SI, a rest period RSI, a sequential driving period SOI, and a concurrent driving period SMOI (or, a simultaneous driving period).

The set signal SET can be the logic high level H and the clock signals can be the first logic low level VGL during the set period SI among the operation periods of the scanline driver 10a.

When the set signal SET is the logic high level H, the first reset transistor 180 can be turned on. When the first reset transistor 180 is turned on, a voltage corresponding to the first logic low level VGL can be provided to the first driving node QN. Here, the first driving signal Q can be the first logic low level VGL. The first logic low level VGL can be a logic low level L illustrated in the timing diagram of FIG. 6.

When the set signal SET is the logic high level H, the second reset transistor 190 can be turned on. When the second reset transistor 190 is turned on, a voltage corresponding to the first logic low level VGL can be provided to the second driving node QBN. Here, the second driving signal QB can be the first logic low level VGL.

In this case, the transferring transistor 111 included in the floating gate transistor 110 can be turned on based on the set signal SET. When the set signal SET is the logic high level H, the transferring transistor 111 can be turned on. When the transferring transistor 111 is turned on, a voltage corresponding to the second logic low level VGL' can be provided to the floating gate FG. In this case, even though the threshold voltage of the floating gate transistor 110 is shifted in a negative direction, the floating gate transistor 110 can be turned off when a voltage of the floating gate FG is a voltage corresponding to the second logic low level VGL' and a voltage of the gate G of the floating gate transistor 110 is a voltage corresponding to the first logic low level VGL.

The scanline driver 10a according to example embodiments can improve a performance by providing (or, including) driving transistors 110 through 170 and buffer transistors 310 and 320 that include the floating gate FG transferred a voltage corresponding to the second logic low level VGL' lower than the first logic low level VGL.

The set signal SET can be the third logic low level VGL" lower than the second logic low level VGL', and the clock signals can be logic high level H during the rest period RSI among the operation periods of the scanline driver 10a.

For example, the clock signals can include the first clock signal CLK1, the second clock signal CLK2, and the third clock signal CLK3. During the reset period RSI, the first clock signal CLK1 can be the logic high level H, the second clock signal CLK2 can be the logic high level H, and the third clock signal CLK3 can be the logic high level H. When the first clock signal CLK1 is the logic high level H, the fifth driving transistor 150 can be turned on. When the fifth driving transistor 150 is turned on, the first clock signal CLK1 can be provided to the second driving node QBN. Here, the first clock signal CLK1 provided to the second driving node QBN can be the logic high level H. When the first clock signal CLK1 provided to the second driving node QBN is the logic high level H, the second driving signal QB can be the logic high level H.

When the second clock signal CLK2 is the logic high level H, the first driving transistor 110 can be turned on. When first driving transistor 110 is turned on, the scan input signal S[N−1] can be provided to the first driving node QN. Here, the scan input signal S[N−1] provided to the first driving node QN can be the first logic low level VGL. When the scan input signal S[N−1] provided to the first driving node QN is the first logic low level VGL, the first driving signal Q can be the logic low level VGL.

The set period SI and the reset period RSI among the operation periods of the scanline driver 10a can periods to initialize the scanline driver 10a. The set period SI and the reset period RSI can be included (or, be operated) in each frame.

The sequential driving period SOI among the operation periods of the scanline driver 10a can include first through sixth period T1 through T6. During the first period T1, the first clock signal CLK1 can be the logic high level H, and the scan input signal S[N−1], the second clock signal CLK2, and the third clock signal CLK3 can be the first logic low level VGL. In this case, the first driving signal Q of the first driving node QN can be the first logic low level VGL, the second driving signal QB of the second driving node QBN can be the logic high level H, and the scan output signal S[N] can be the first logic low level VGL.

During the second period T2, the scan input signal S[N−1], the first clock signal CLK1, and the second clock signal CLK2 can be the logic high level H, and the third clock signal CLK3 can be the first logic low level VGL. In this case, the first driving signal Q of the first driving node QN can be the logic high level H, the second driving signal QB of the second driving node QBN can be the logic high level H, and the scan output signal S[N] can be the logic low level.

During the third period T3, the scan input signal S[N−1], the second clock signal CLK2, and the third clock signal CLK3 can be the logic high level H, and the first clock signal CLK1 can be the first logic low level VGL. In this case, the first driving signal Q of the first driving node QN can be a boosting level 2H higher than the logic high level H, the second driving signal QB of the second driving node QBN can be the first logic low level VGL, and the scan output signal S[N] can be the logic high level H. During the third period T3, the third clock signal CLK3 can be transferred as an output of the buffer circuit 300a when the first buffer transistor 310 is turned on. Here, the first driving signal Q of the first driving node QN can be boosted to be the boosting level 2H higher than the logic high level H by a pull-up capacitor CPU.

During the fourth period T4, the third clock signal CLK3 can be the logic high level H, and the scan input signal S[N−1], the first clock signal CLK1, and the second clock signal CLK2 can be the first logic low level VGL. In this case, the first driving signal Q of the first driving node QN can be the boosting level 2H higher than the logic high level H, the second driving signal QB of the second driving node QBN can be the first logic low level VGL, and the scan output signal S[N] can be the logic high level H.

During the fifth period T5, the first clock signal CLK1 can be the logic high level H, and the scan input signal S[N−1], the second clock signal CLK2, and the third clock signal CLK3 can be the first logic low level VGL. In this case, the first driving signal Q of the first driving node QN can be the logic high level H, the second driving signal QB of the second driving node QBN can be the logic high level H, and the scan output signal S[N] can be the first logic low level VGL.

During the sixth period T6, the first clock signal CLK1 and the second clock signal CLK2 can be the logic high level H, and the scan input signal S[N−1] and the third clock signal CLK3 can be the first logic low level VGL. In this case, the first driving signal Q of the first driving node QN can be the first logic low level VGL, the second driving signal QB of the second driving node QBN can be the logic high level H, and the scan output signal S [N] can be the first logic low level VGL.

During the concurrent driving period SMOI among the operation periods of the scanline driver 10a, the first clock signal CLK1, the second clock signal CLK2, and the third clock signal CLK3 can be the first logic low level VGL, and the scan input signal S[N−1] can be the logic high level H. In this case, the scan output signal S[N] can be the logic high level H.

Figure 7:
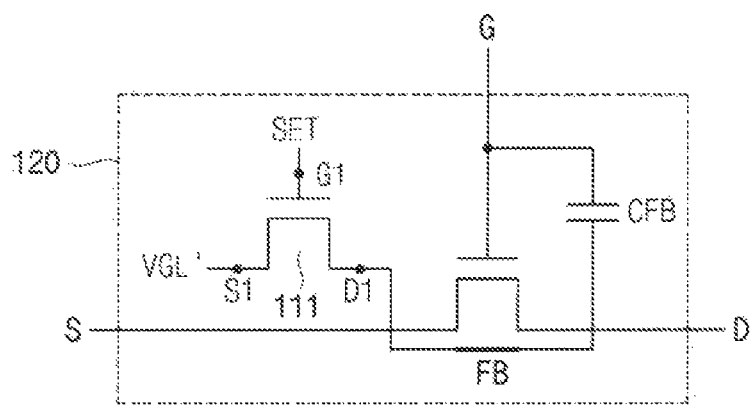
FIG. 7 is a circuit diagram illustrating an example of a floating gate transistor included in the scanline driver of FIG. 1.

FIG. 7 is a circuit diagram illustrating an example of the floating gate transistor 110 included in the scanline driver 10a of FIG. 1.

Referring to FIG. 7, the floating body transistor 120 includes a body capacitor CFB, a floating body FB, and a transferring transistor 111. The body capacitor CFB included in the floating body transistor 120 can electrically connect a gate G of the floating body transistor 120 with the floating body FB of the floating body transistor 120. That is, the body capacitor CFB can be disposed between the gate G of the floating body transistor 120 and the floating body FB of the floating body transistor 120.

In some example embodiments, the floating body FB is electrically connected to a first terminal of the transferring transistor 111, and a voltage corresponding to the second logic low level VGL' is provided to a second terminal of the transferring transistor 111. For example, the first terminal of the transferring transistor 111 is a drain D1 of the transferring transistor 111, and the second terminal of the transferring transistor 111 is a source S1 of the transferring transistor 111. The second logic low level VGL' can be lower than the first logic low level VGL. The floating body FB can be electrically connected to the drain D1 of the transferring transistor 111, and a voltage corresponding to the second logic low level VGL' can be provided to the source S1 of the transferring transistor 111.

In some example embodiments, the transferring transistor 111 is turned on based on a set signal SET. When the set signal SET is logic high level H, the transferring transistor 111 can be turned on. When the transferring transistor 111 is turned on, a voltage corresponding to the second logic low level VGL' can be provided to the floating body FB.

For example, at the first time TA, a threshold voltage of the floating body transistor 120 is a first threshold voltage VTH1. At the second time TB after the first time TA, the threshold voltage of the floating body transistor 120 can be a second threshold voltage VTH2. The first threshold voltage VTH1, which is the threshold voltage of the floating body transistor 120 at the first time TA, can be about 0.5 V, and the second threshold voltage VTH2, which is the threshold voltage of the floating body transistor 120 at the second time TB, can be about 0 V. In addition, a voltage corresponding to the logic high level H can be about 1 V, a voltage corresponding to the first logic low level can be about 0 V, and a voltage corresponding to the second logic low level VGL' can be about −1 V.

At the first time TA, the transferring transistor 111 can be turned on when the set signal SET is (or, has) about 1 V. When the transferring transistor 111 is turned on, about −1 V, which is a voltage corresponding to the second logic low level, can be provided to the floating body FB. When a voltage of the gate G of the floating body transistor 120 is about 0 V, which is the first logic low level VGL, and a voltage of the floating body FB is about −1 V, the floating body transistor 120 can be tuned off. Because about −1 V, which is a voltage of the floating body FB, is lower than about 0.5 V which is the first threshold voltage VTH1.

At the second time TB, the transferring transistor 111 can be turned on when the set signal SET is 1 V. When the transferring transistor 111 is turned on, about −1 V, which is a voltage corresponding to the second logic low level, can be provided to the floating body FB. When a voltage of the gate G of the floating body transistor 120 is about 0 V, which is the first logic low level VGL, and a voltage of the floating body FB is about −1 V, the floating body transistor 120 can be tuned off. Because about −1 V, which is a voltage of the floating body FB, is lower than about 0 V which is the second threshold voltage VTH2.

In some example embodiments, the floating body transistor 120 is turned off when a voltage of the floating body FB is a voltage corresponding to the second logic low level VGL' and a voltage of the gate G of the floating body transistor 120 is a voltage corresponding to the first logic low level VGL.

An operation of the transferring transistor 111 can be substantially the same as an operation of the transferring transistor 111 described with reference to FIG. 4. Therefore, duplicated descriptions will not be repeated.

Figure 8:
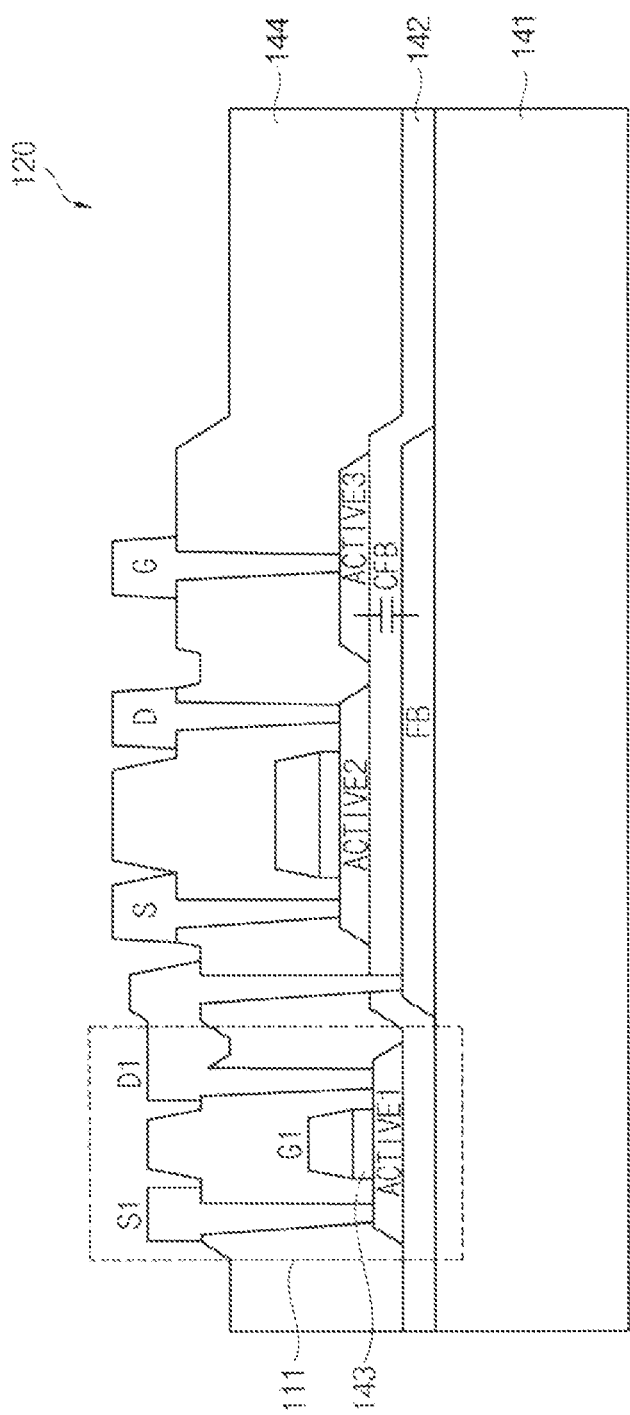
FIG. 8 is a cross-sectional view illustrating an example of the floating gate transistor of FIG. 7.

FIG. 8 is a cross-sectional view illustrating an example of the floating gate transistor 120 of FIG. 7.

Referring to FIGS. 7 and 8, the floating body transistor 120 includes a body capacitor CFB, a floating body FB, and a transferring transistor 111. The floating body FB can be disposed on a substrate 141. The first insulating layer 142 can be disposed on the floating body FB. An active region (or, an active pattern) can be disposed on the first insulating layer 142. The active region can include a first active region ACTIVE1, a second active region ACTIVE2, and a third active region ACTIVE3. A second insulating layer 143 can be disposed on the first active region ACTIVE1 and the second active region ACTIVE2. The gate G1 of the transferring transistor 111 and the gate G of the floating body transistor 120 can be disposed on the second insulating layer 143.

When a voltage corresponding to the logic high level H is provided to the gate G1 of the transferring transistor 111, a voltage corresponding to the second logic low level VGL' can be transferred from the source S1 of the transferring transistor 111 through the first active region ACTIVE1 to the drain D1 of the transferring transistor 111. The drain D1 of the transferring transistor 111 can be electrically connected to the floating body FB. When the voltage corresponding to the second logic low level VGL' is transferred from the source S1 of the transferring transistor 111 through the first active region ACTIVE1 to the drain D1 of the transferring transistor 111, a voltage of the floating body FB can be a voltage corresponding to the second logic low level VGL'. When the voltage of the floating body FB is the voltage corresponding to the second logic low level VGL' and the voltage of the gate G of the floating body transistor 120 is the voltage corresponding to the first logic low level VGL, the floating body transistor 120 can be turned off.

The scanline driver 10a according to example embodiments can improve a performance by providing (or, including) driving transistors 110 through 170 and buffer transistors 310 and 320 that include the floating body FB that can transfer a voltage corresponding to the second logic low level VGL' lower than the first logic low level VGL.

Figure 9:
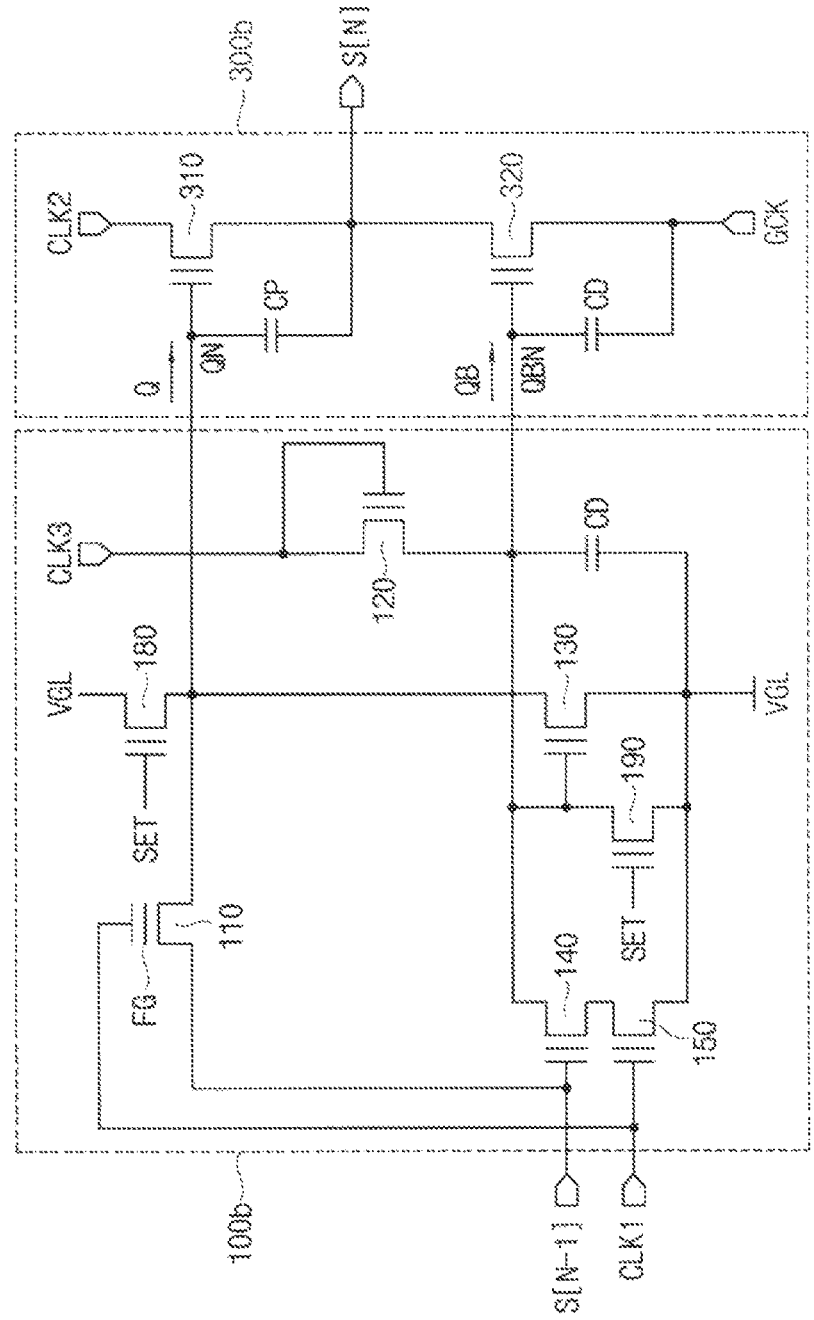
FIG. 9 is a circuit diagram illustrating a scanline driver according to example embodiments.
Figure 10:
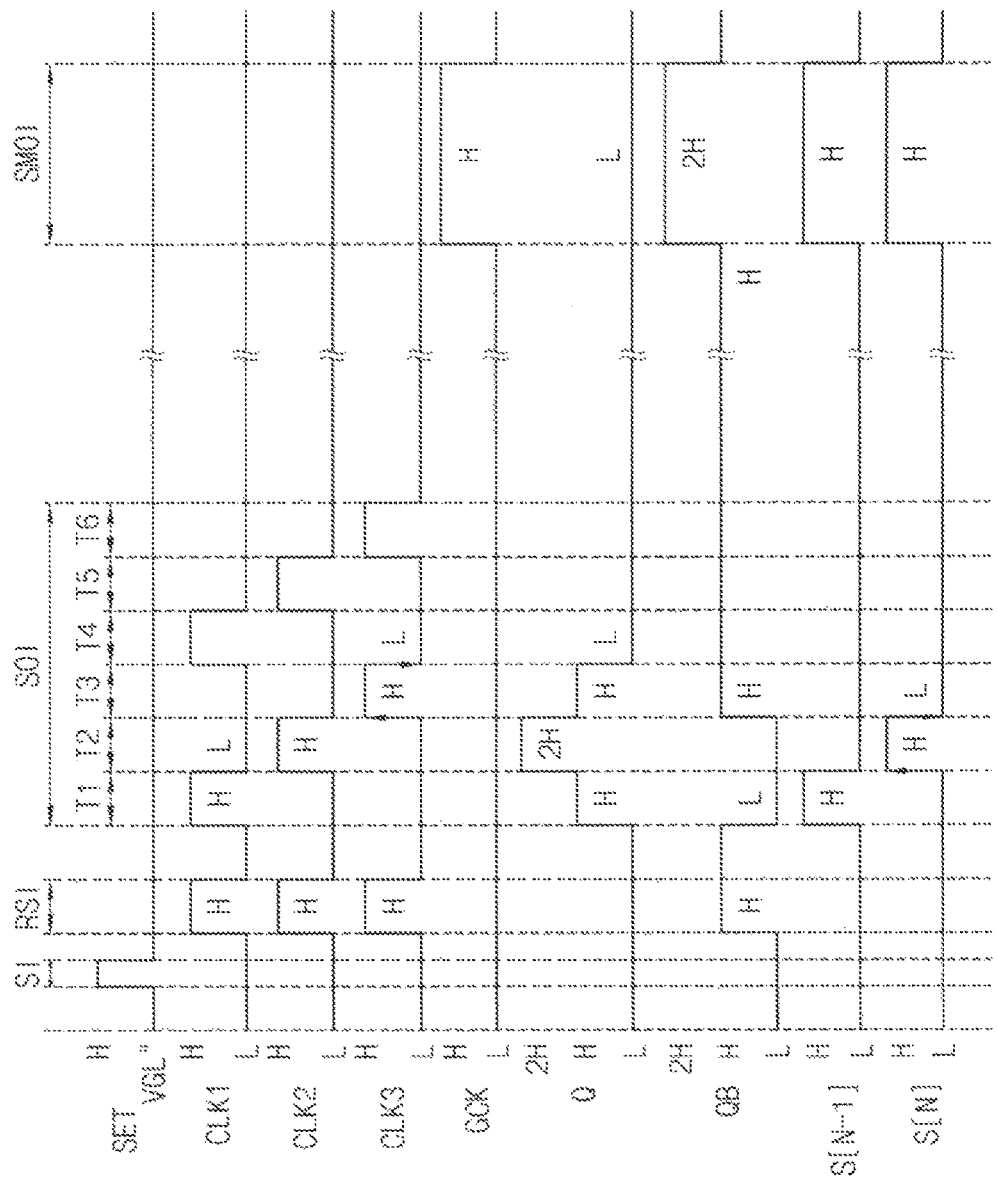
FIG. 10 is a timing diagram illustrating examples of operation periods of the scanline driver of FIG. 9.

FIG. 9 is a circuit diagram illustrating a scanline driver 10b according to example embodiments. FIG. 10 is a timing diagram illustrating examples of operation periods of the scanline driver 10b of FIG. 9.

Referring to FIGS. 9 and 10, the scanline driver 10b can include a driving circuit 100b and a buffer circuit 300b. The driving circuit 100b can include driving transistors 100 through 150 and reset transistors 180 and 190 (or, reset-transistors). For example the driving transistors include first through fifth driving transistors 110 through 150, and the reset transistors include a first reset transistor 180 and the second reset transistor 190.

The driving circuit 100b can provide a first driving signal Q to a first driving node QN and can provide a second driving signal QB to a second driving node QBN based on a scan input signal S[N−1] and clock signals. The buffer circuit 300b can include buffer transistors 310 and 320. The buffer circuit 300b can provide (or, transfer) a scan output signal S[N] based on the first driving signal Q and the second driving signal QB. For example, the buffer transistors include a first buffer transistor 310 and a second buffer transistor 320.

The operation periods of the scanline driver 10b can include a set period SI, a rest period RSI, a sequential driving period SOI, and a concurrent driving period SMOI (or, a simultaneous driving period).

An operation of the scanline driver 10b during the set period SI, the rest period RSI, and the concurrent driving period SMOI can be the same as an operation of the scanline driver 10a described with reference to FIG. 6.

During the sequential driving period SOI among the operation periods of the scanline driver 10b, a second clock signal CLK2 and a third clock signal CLK3 among the clock signals can be the first logic low level VGL when the first clock signal CLK1 among the clock signals is the logic high level H.

For example, the sequential driving period SOI includes first through sixth period T1 through T6. During the first period T1, the first clock signal CLK1 can be the logic high level H, and the second clock signal CLK2 and the third clock signal CLK3 can be the first logic low level VGL. During the second period T2, the second clock signal CLK2 can be the logic high level H, and the first clock signal CLK1 and the third clock signal CLK3 can be the first logic low level VGL. During the third period T3, the third clock signal CLK3 can be the logic high level H, and the first clock signal CLK1 and the second clock signal CLK2 can be the first logic low level VGL. In this case, two clock signals among the clock signal are not the logic high level H during the sequential driving period SOI.

Figure 11:
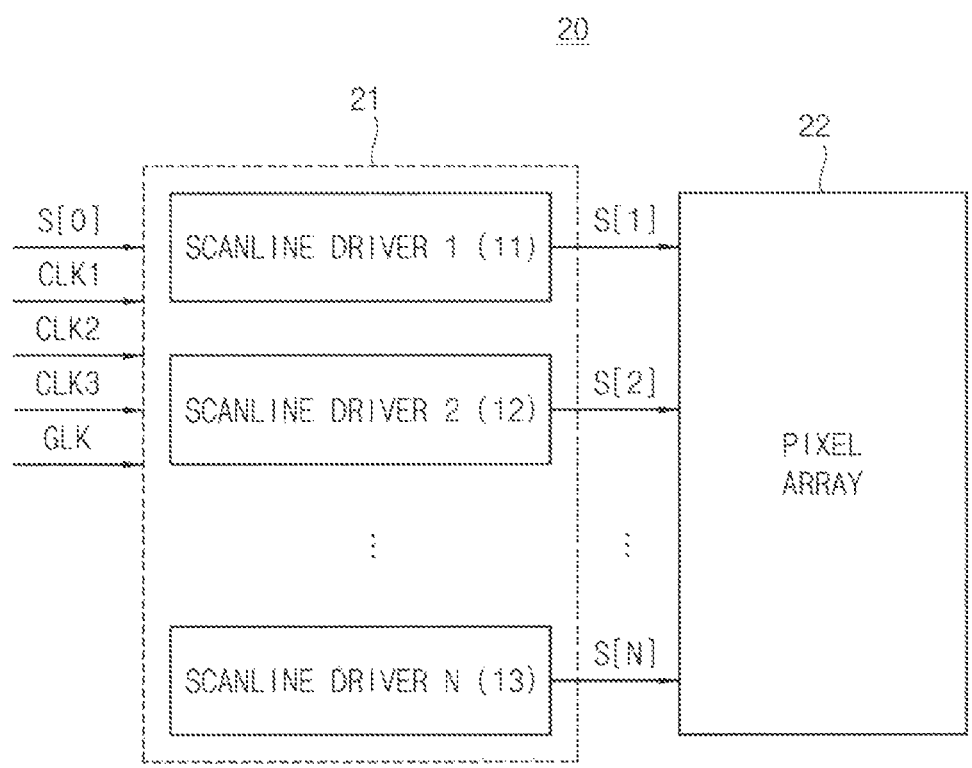
FIG. 11 is a block diagram illustrating a display device according to example embodiments.

FIG. 11 is a block diagram illustrating a display device 20 according to example embodiments. Depending on embodiments, certain elements may be removed from or additional elements may be added to the display device 20 illustrated in FIG. 11. Furthermore, two or more elements may be combined into a single element, or a single element may be realized as multiple elements. This also applies to the remaining disclosed embodiments.

Referring to FIGS. 1 and 11, the display device 20 includes scanline drivers 21 and a pixel array 22. For example, the scanline drivers 21 include first through (N)th scanline driver 11, 12, and 13. The scanline drivers 21 can provide a scan output signal S[N] to a scanline based on clock signals and a scan input signal S[N−1]. A scan start pulse S[0] can be provided to a first scanline driver 11 included in the scanline drivers 21. The pixel array 22 can be driven based on the scan output signal S[N].

Each of the scanline drivers 21 (e.g., the first through third scanline drivers 11, 12, and 13) can include the driving circuit 100a and the buffer circuit 300a. The driving circuit 100a can include driving transistors 110 through 170 and reset transistors 180 and 190, can provide the first driving signal Q to the first driving node QN based on the scan input signal S[N−1] and clock signals, and can provide the second driving signal QB to the second driving node QBN based on the scan input signal S[N−1] and clock signals. The buffer circuit 300a can include buffer transistors 310 and 320 and can generate the scan output signal S[N] based on the first driving signal Q and the second driving signal QB. The floating gate transistor 110 (or, the floating body transistor 120) can include the floating gate FG (or, the floating body FB) which can transfer a voltage corresponding to the second logic low level VGL' lower than the first logic low level VGL.

The floating gate FG (or, the floating body FB) can be electrically connected to the first terminal of the transferring transistor 111, a voltage corresponding to the second logic low level VGL' can be provided to the second terminal of the transferring transistor 111, and the transferring transistor 111 can be turned on based on the set signal SET.

The scanline driver 10a according to example embodiments can improve a performance by providing (or, including) the driving transistors 110 through 170 and the buffer transistors 310 and 320 that include the floating gate FG (or, the floating body FB) which can transfer a voltage corresponding to the second logic low level VGL' lower than the first logic low level VGL.

Figure 12:
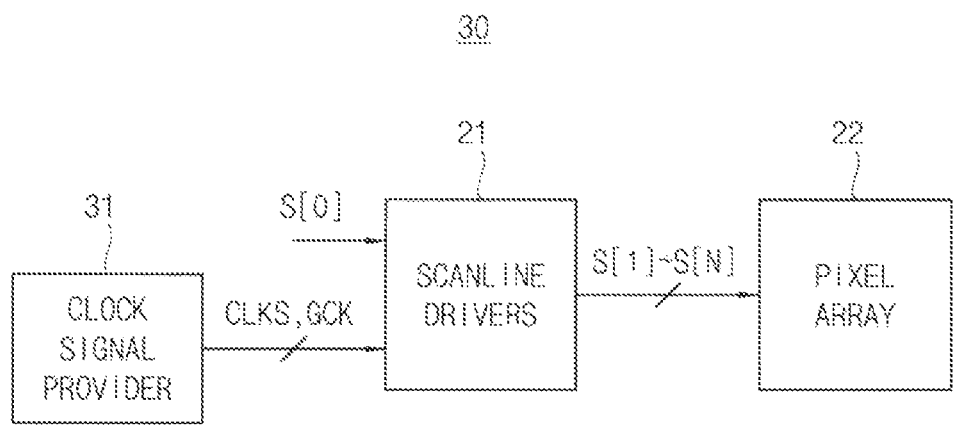
FIG. 12 is a block diagram illustrating a display device according to example embodiments.

FIG. 12 is a block diagram illustrating a display device 30 according to example embodiments.

Referring to FIGS. 1 and 12, the display device 30 includes a clock signal provider 31 (or, a clock signal generator), scanline drivers 21, and a pixel array 22. The clock signal provider 31 can generate (or, provide) clock signals CLKS and GCK. The scanline drivers 21 can provide a scan output signal S[N] to a scanline based on the clock signals and an scan input signal S[N−1]. A scan start pulse S[0] can be provided to the scanline drivers 21. The pixel array 22 can be driven based on the scan output signal S[N]. Each of the scanline drivers 21 (e.g., the first through third scanline drivers 11, 12, and 13 illustrated in FIG. 11) can include the driving circuit 100a and the buffer circuit 300a. The driving circuit 100a can include driving transistors 110 through 170 and reset transistors 180 and 190, can provide the first driving signal Q to the first driving node QN based on the scan input signal S[N−1] and clock signals, and can provide the second driving signal QB to the second driving node QBN based on the scan input signal S[N−1] and clock signals. The buffer circuit 300a can include buffer transistors 310 and 320 and can generate the scan output signal S[N] based on the first driving signal Q and the second driving signal QB. The floating gate transistor 110 (or, the floating body transistor 120) can include the floating gate FG (or, the floating body FB) which can transfer a voltage corresponding to the second logic low level VGL' lower than the first logic low level VGL.

Figure 13:
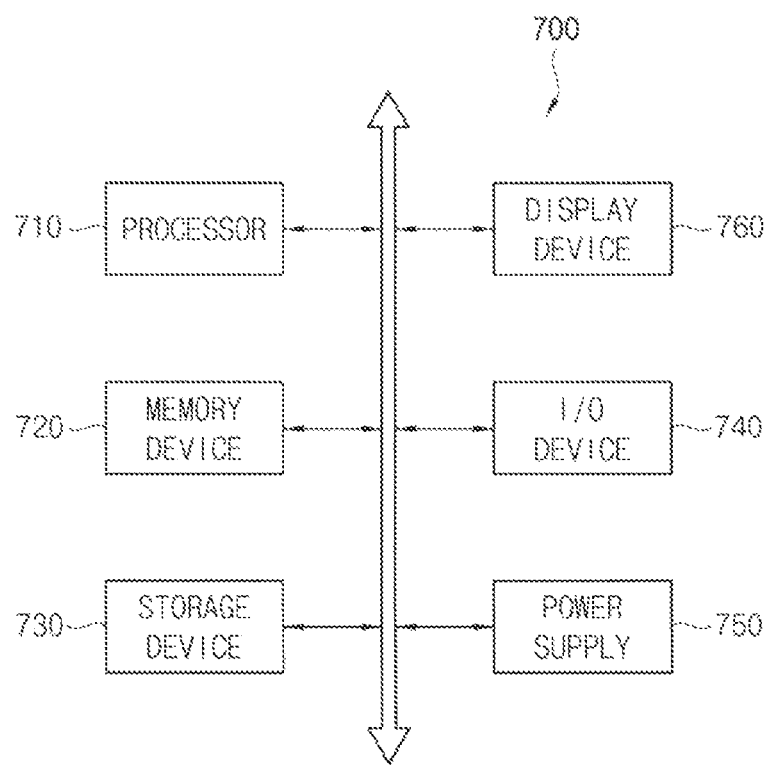
FIG. 13 is a block diagram illustrating an example of applying a display device according to example embodiments to a computer system.

FIG. 13 is a block diagram illustrating an example of applying a display 760 device according to example embodiments to a computer system 700.

Referring to FIG. 13, the computer system 700 can include a processor 710, a memory device 720, a storage device 730, an input/output device 740, a power supply 750, and the display device 760. The computer system 700 can further include ports to communicate with a video card, a sound card, a memory card, a USB device, other systems, and etc.

The processor 710 can operate a certain calculation and a task. In some example embodiments, the process 710 is a microprocessor, a central processing unit (CPU), and etc. The processor 710 can be electrically connected to other components through a address bus, a control bus, a data bus, and etc. In some example embodiments, the processor 710 is electrically connected to an extension bus such as a peripheral component interconnect (PCI) bus.

The memory device 720 can store data required to drive the computer system 700. For example, the memory device 720 includes a non-volatile memory device such as an Erasable Programmable Read-Only Memory (EPROM), an Electrically Erasable Programmable Read-Only Memory (EEPROM), a Flash Memory, a Phase Change Random Access Memory (PRAM), a Resistance Random Access Memory (RRAM), a Nano Floating Gate Memory (NFGM), a Polymer Random Access Memory (PoRAM), a Magnetic Random Access Memory (MRAM), a Ferroelectric Random Access Memory (FRAM), and etc and/or a volatile memory device such as a Dynamic Random Access Memory (DRAM), a Static Random Access Memory (SRAM), a mobile DRAM, and etc.

The storage device 730 can include a Solid State Drive (SSD), a Hard Disk Drive (HDD, a CD-ROM, and etc. The input/output device 740 can include an input means such as a keyboard, a keypad, a touch pad, a touch screen, a mouse, and etc and an output means such as a speaker, a printer, and etc. The power supply 750 can provide a power required to drive the computer system 700. The display device 760 can be electrically connected to other components through the buses or other communication links.

In some example embodiments, the computer system 700 is any electronic device which includes the display device 760 such as digital TVs, 3-dementional (3D) TVs, personal computers (PCs), home electronics, laptop computers, tablet computers, cell phones, smartphones, personal digital assistants (PDAs), portable multimedia players (PMPs), digital cameras, music players, portable game consoles, GPS, etc.

The described technology can be applied to any display system to improve performance by providing driving transistors and buffer transistors which include a floating gate (or, floating body) which can transfer a voltage corresponding to a second logic low level lower than a first logic low level.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A scanline driver comprising:
a driving circuit configured to provide a first driving signal to a first driving node and a second driving signal to a second driving node based on a scan input signal and a plurality of clock signals, wherein the driving circuit includes a plurality of driving transistors and a plurality of reset transistors; and
a buffer circuit configured to generate a scan output signal based on the first and second driving signals, wherein the buffer circuit includes a plurality of buffer transistors,
wherein each of the driving transistors and the buffer transistors includes a floating gate transistor which includes a floating gate configured to transfer a voltage corresponding to a second logic low level lower than a first logic low level.

2. The scanline driver of claim 1, wherein the floating gate transistor includes a gate capacitor configured to electrically connect a gate electrode of the floating gate transistor and the floating gate.

3. The scanline driver of claim 1, wherein the floating gate transistor includes a transferring transistor having a first terminal and a second terminal, wherein the floating gate is electrically connected to the first terminal, and wherein the second terminal is configured to receive a voltage corresponding to the second logic low level.

4. The scanline driver of claim 3, wherein the transferring transistor is configured to be turned on based on a set signal.

5. The scanline driver of claim 4, wherein the transferring transistor is configured to be turned on when the set signal has a logic high level, and wherein the floating gate is configured to receive a voltage corresponding to the second logic low level.

6. The scanline driver of claim 5, wherein the transferring transistor is configured to be turned off when i) a voltage at the floating gate is a voltage corresponding to the second logic low level and ii) a voltage at the gate electrode of the floating gate transistor is a voltage corresponding to the first logic low level.

7. The scanline driver of claim 4, wherein the transferring transistor is configured to be turned off when the set signal has a third logic low level different from the first and second logic low levels.

8. The scanline driver of claim 7, wherein the third logic low level is lower than the second logic low level.

9. The scanline driver of claim 1, wherein the reset transistors include a first reset transistor having a first terminal electrically connected to the first driving node and a second terminal, and wherein the second terminal of the first reset transistor is configured to receive a voltage corresponding to the first logic low level.

10. The scanline driver of claim 9, wherein the first reset transistor is configured to be turned on based on a set signal.

11. The scanline driver of claim 10, wherein the first reset transistor is configured to be turned on when the set signal has a logic high level greater than the first and second logic low levels, and wherein the first driving node is configured to receive a voltage corresponding to the first logic low level.

12. The scanline driver of claim 1, wherein the reset transistors further include a second reset transistor having a first terminal electrically connected to the second driving node and a second terminal, and wherein the second terminal of the second reset transistor is configured to receive a voltage corresponding to the first logic low level.

13. The scanline driver of claim 12, wherein the second reset transistor is configured to be turned on based on a set signal.

14. The scanline driver of claim 13, wherein the second reset transistor is configured to be turned on when the set signal has a logic high level, and wherein the second driving node is configured to receive a voltage corresponding to the first logic low level.

15. The scanline driver of claim 1, wherein the scanline driver has a plurality of operation periods including a set period, wherein a set signal has a logic high level during the set period, and wherein each of the dock signals has the first logic low level during the set period.

16. The scanline driver of claim 15, wherein the operation periods further include a reset period, wherein the set signal has a third logic low level lower than the second logic low level during the reset period, and wherein each of the clock signals has the logic high level during the reset period.

17. The scanline driver of claim 16, wherein the operation periods further include a sequential driving period, wherein the clock signals include first, second and third clock signals, and wherein each of the second and third clock signals has the first logic low level when the first clock signal has the logic high level during the sequential driving period.

18. A display device comprising:
a plurality of scanline drivers each configured to provide a scan output signal to a scanline based on a plurality of clock signals and a scan input signal; and
a pixel array configured to be driven based on the scan output signal,
wherein each of the scanline drivers includes:
a driving circuit configured to provide a first driving signal to a first driving node and a second driving signal to a second driving node based on the scan input signal and the clock signals, wherein the driving circuit includes a plurality of driving transistors and a plurality of reset transistors; and
a buffer circuit configured to generate a scan output signal based on the first and second driving signals, wherein the buffer circuit includes a plurality of buffer transistors, and
wherein each of the driving transistors and the buffer transistors is includes a floating gate transistor which includes a floating gate configured to transfer a voltage corresponding to a second logic low level lower than a first logic low level.

19. The display device of claim 18, wherein the floating gate transistor includes a transferring transistor having a first terminal and a second terminal, wherein the floating gate is electrically connected to the first terminal, wherein the second terminal is configured to receive a voltage corresponding to the second logic low level, and wherein the transferring transistor is configured to be turned on based on a set signal.

20. A display device comprising:
a clock signal provider configured to generate a plurality of clock signals;
a plurality of scanline drivers each configured to provide a scan output signal to a scanline based on the clock signals and a scan input signal; and
a pixel array configured to be driven based on the scan output signal,
wherein each of the scanline drivers includes:
a driving circuit configured to provide a first driving signal to a first driving node and a second driving signal to a second driving node based on the scan input signal and the clock signals, wherein the driving circuit includes a plurality of driving transistors and a plurality of reset transistors; and
a buffer circuit configured to generate a scan output signal based on the first and second driving signals, wherein the buffer circuit includes a plurality of buffer transistors, and
wherein each of the driving transistors and the buffer transistors includes a floating gate transistor which includes a floating gate configured to transfer a voltage corresponding to a second logic low level lower than a first logic low level.

21. A scanline driver comprising:
a driving circuit configured to provide a first driving signal to a first driving node and a second driving signal to a second driving node based on a scan input signal and a plurality of clock signals, wherein the driving circuit includes a plurality of driving transistors and a plurality of reset transistors; and
a buffer circuit configured to generate a scan output signal based on the first and second driving signals, wherein the buffer circuit includes a plurality of buffer transistors,
wherein each of the driving transistors and the buffer transistors is includes a floating body transistor which includes a floating body configured to transfer a voltage corresponding to a second logic low level lower than a first logic low level.

22. The scanline driver of claim 21, wherein the floating body transistor includes a gate electrode and a gate capacitor configured to electrically connect the gate electrode and the floating body.

23. The scanline driver of claim 22, wherein the floating body transistor includes a transferring transistor having a first terminal and a second terminal, wherein the floating body is electrically connected to the first terminal, and wherein the second terminal of the transferring transistor is configured to receive a voltage corresponding to the second logic low level.

24. The scanline driver of claim 23, wherein the transferring transistor is configured to be turned on based on a set signal, and wherein the floating body is configured to receive a voltage corresponding to the second logic low level.

25. The scanline driver of claim 24, wherein the transferring transistor is configured to be turned off when i) a voltage at the floating body is a voltage corresponding to the second logic low level, and ii) a voltage at the gate electrode of the floating body transistor is a voltage corresponding to the first logic low level.

* * * * *